United States Patent
Woo et al.

(10) Patent No.: US 11,100,871 B2
(45) Date of Patent: Aug. 24, 2021

(54) DISPLAY DEVICE AND DRIVING METHOD OF THE SAME

(71) Applicant: LG Display Co., Ltd., Seoul (KR)

(72) Inventors: Inchul Woo, Seoul (KR); SunYoon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/115,630

(22) Filed: Dec. 8, 2020

(65) Prior Publication Data

US 2021/0201826 A1 Jul. 1, 2021

(30) Foreign Application Priority Data

Dec. 31, 2019 (KR) .......................... 10-2019-0179653

(51) Int. Cl.
  *G09G 5/02* (2006.01)
  *G09G 3/32* (2016.01)
  *G09G 3/3291* (2016.01)
  *H01L 27/32* (2006.01)

(52) U.S. Cl.
  CPC ........ *G09G 3/3291* (2013.01); *H01L 27/3218* (2013.01); *G09G 2310/0272* (2013.01); *G09G 2320/0666* (2013.01); *G09G 2360/16* (2013.01)

(58) Field of Classification Search
  CPC ................... G09G 3/32; G09G 3/3291; G09G 2310/0272; G09G 2320/0666; G09G 2360/16; G09G 5/00; G09G 3/36; G09G 5/02; H01L 27/3218; G06F 3/038
  See application file for complete search history.

(56) References Cited

U.S. PATENT DOCUMENTS

| | | | |
|---|---|---|---|
| 2007/0159536 A1* | 7/2007 | Lin | H04N 9/73 348/223.1 |
| 2009/0231462 A1* | 9/2009 | Kitajima | H04N 9/735 348/223.1 |
| 2010/0053137 A1* | 3/2010 | Park | G09G 3/3225 345/211 |
| 2015/0097880 A1* | 4/2015 | Ooga | G09G 3/3406 345/694 |
| 2017/0221404 A1* | 8/2017 | Park | G09G 3/2092 |

FOREIGN PATENT DOCUMENTS

KR  10-2018-0061450 A  6/2018

* cited by examiner

*Primary Examiner* — Pegeman Karimi
(74) *Attorney, Agent, or Firm* — Seed IP Law Group LLP

(57) ABSTRACT

The display device also includes a threshold voltage sensor configured to sense a threshold voltage of a white light emitting element included in the white sub-pixel, a data compensation unit configured to correct data signal depending on a variation in the threshold voltage and generate compensated data signal and a data driver configured to generate a data voltage according to the compensated data signal and output the data voltage to the display panel. The data compensation unit calculates an initial white gain depending on the variation in the threshold voltage. Therefore, the lifetime of the display device can be improved.

13 Claims, 12 Drawing Sheets

DISPLAY DEVICE AND DRIVING METHOD OF THE SAME

CROSS-REFERENCE TO RELATED APPLICATIONS

This application claims the priority of Korean Patent Application No. 10-2019-0179653 filed on Dec. 31, 2019, in the Korean Intellectual Property Office, the disclosure of which is incorporated herein by reference.

BACKGROUND

Technical Field

The present disclosure relates to a display device and a driving method of the same, and more particularly, to a display device which can improve the reliability of white pixels and a driving method of the same.

Description of the Related Art

With the development of information society, various demands for display devices for displaying images are increasing. In recent years, various flat panel displays are developed and marketed which are capable of reducing weight and volume which are disadvantages of a cathode ray tube (CRT). Such various display device includes, for example, a liquid crystal display (LCD), a plasma display panel (PDP), an organic light emitting diode (OLED), and the like.

A display panel of a display device includes a plurality of pixels formed adjacent to the overlapping locations of the gate lines and data lines. Each of the plurality of pixels includes at least one light emitting element, and at least one light emitting element implement a gray scale corresponding to a data voltage depending on a gate voltage.

As the light emitting element is driven continuously, it becomes degraded. The degraded light emitting element cannot implement a gray scale corresponding to a data voltage, which may cause the deterioration of image quality of the display device due to the degradation.

BRIEF SUMMARY

The inventors of the present disclosure have identified that, particularly, when a luminance deviation of about 5% occurs in white light emitting elements due to their degradation, a user perceives as image sticking and the image sticking caused by the degradation of white light emitting elements is a problem in the related art. Accordingly, the inventors having identifying and acknowledging the technical problem, provides a display device which can suppress the deterioration of image quality caused by the degradation of white light emitting elements, and a driving method of the same.

Another technical benefit as provided by a display device according to the present disclosure is the device can secure the reliability of white light emitting elements while compensating for the degradation of the white light emitting elements, and a driving method of the same.

The technical benefits of the present disclosure are not limited to the above-mentioned benefits, and other benefits, which are not mentioned above, can be clearly understood by those skilled in the art from the following descriptions.

According to an aspect of the present disclosure, a display device is provided. The display device includes a display panel including a plurality of pixels each composed of a red sub-pixel, a green sub-pixel, a blue sub-pixel and a white sub-pixel. The display device also includes a threshold voltage sensor configured to sense a threshold voltage of a white light emitting element included in the white sub-pixel. The display device further includes a data compensation unit configured to correct data signal depending on a variation in the threshold voltage and generate compensated data signal. The display device also includes a data driver configured to generate a data voltage according to the compensated data signal and output the data voltage to the display panel. The data compensation unit calculates an initial white gain depending on the variation in the threshold voltage. Also, if the initial white gain is higher than a critical white gain, the data compensation unit converts an excess white gain corresponding to a difference between the initial white gain and the critical white gain into a red gain, a green gain and a blue gain. Further, the data compensation unit applies the red gain to red data signal, the green gain to green data signal and the blue gain to blue data signal to generate the compensated data signal. Therefore, the lifetime of the display device can be improved.

Other detailed matters of the embodiments are included in the detailed description and the drawings.

According to the present disclosure, it is possible to solve image sticking caused by the degradation of white light emitting elements. Also, it is possible to reduce or minimize stress applied to the white light emitting elements. Therefore, it is possible to improve the reliability of the white light emitting elements.

According to the present disclosure, it is possible to control a color temperature which may be distorted by increasing a driving current of the white light emitting elements and thus possible to improve the image quality.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
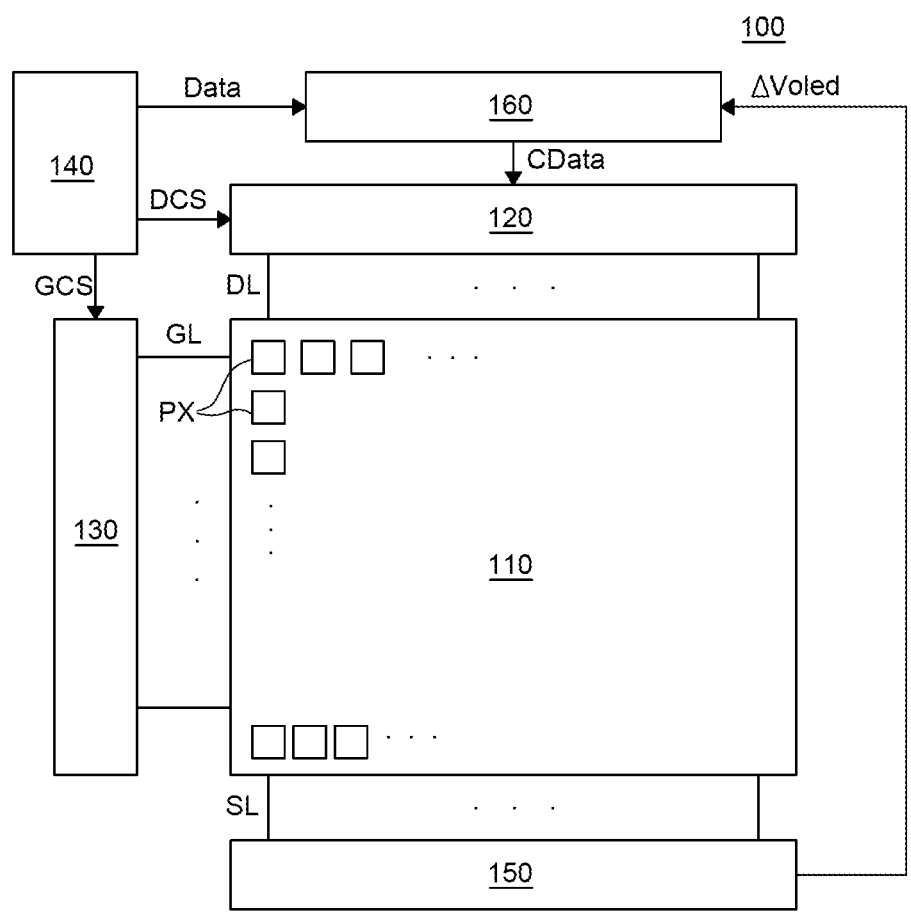
FIG. 1 is a schematic block diagram provided to explain a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

FIG. 1 is a schematic block diagram provided to explain a display device according to an embodiment of the present disclosure.

Referring to FIG. 1, a display device 100 according to an embodiment of the present disclosure includes a display panel 110, a data driver 120, a gate driver 130, a timing controller 140, a threshold voltage sensor 150 and a data compensation circuit 160. A data compensation circuit 160 (which may be referred to herein as a data compensation module or a data compensation unit 160) may include any electrical circuitry, features, components, an assembly of electronic components or the like configured to perform the various operations of the data compensation features of the data compensation unit as described herein. In some embodiments, the data compensation unit 160 may be included in or otherwise implemented by processing circuitry such as a microprocessor, microcontroller, integrated circuit, chip, microchip or the like.

The display panel 110 includes a plurality of gate lines GL and a plurality of data lines DL crossing each other in a matrix form on a substrate using glass or plastic. Further, a plurality of pixels PX is formed adjacent to the plurality of gate lines GL and the plurality of data lines DL.

Further, each of the plurality of pixels PX of the display panel 110 is connected to a gate line GL and a data line DL. The plurality of pixels PX is configured to operate based on a gate voltage transmitted from the gate lines GL and a data voltage transmitted from the data lines DL.

Each of the plurality of pixels PX may include a red sub-pixel emitting red light, a green sub-pixel emitting green light, a blue sub-pixel emitting blue light and a white sub-pixel emitting white light.

Further, the red sub-pixel includes a red light emitting element to emit red light. The green sub-pixel includes a green light emitting element to emit green light. The blue sub-pixel includes a blue light emitting element to emit blue light. The white sub-pixel includes a white light emitting element to emit white light.

However, each of the plurality of pixels PX is not limited thereto and may include various color sub-pixels.

Herein, each of the plurality of pixels PX includes the white sub-pixel emitting white light, and, thus a data voltage output to the red sub-pixel, the green sub-pixel and the blue sub-pixel can be reduced. Therefore, the total power consumption of the display device 100 can be reduced.

Further, if the foldable display device 100 according to an embodiment of the present disclosure is an organic light emitting display device, if a current is applied to organic light emitting diodes included in the plurality of pixels PX, released electrons and holes are recombined into excitons. Then, if the excitons emit light, a gray scale of the organic light emitting display device is implemented.

However, the foldable display device 100 according to an embodiment of the present disclosure is not limited to the organic light emitting display device and may be one of various display devices such as a liquid crystal display device.

The timing controller 140 supplies a data control signal DCS to the data driver 120 to control the data driver 120 and supplies a gate control signal GCS to the gate driver 130 to control the gate driver 130.

That is, the timing controller 140 starts scanning operation at a corresponding time for each frame based on timing signals received from an external host system.

More specifically, the timing controller 140 receives various timing signals together with image data Data from the external host system. The various timing signals include a vertical synchronization signal (Vsync), a horizontal synchronization signal (Hsync), a data enable signal (DE) and a data clock signal (DCLK).

To control the data driver 120 and the gate driver 130, the timing controller 140 receives the timing signals including a vertical synchronization signal (Vsync), a horizontal synchronization signal (Hsync), a data enable signal (DE) and a data clock signal (DCLK), generates various control signals DCS and GCS and outputs the control signals to the data driver 120 and the gate driver 130.

For example, the timing controller 140 outputs various gate control signals GCS including a gate start pulse (GSP), a gate shift clock (GSC) and a gate output enable signal (GOE) to control the gate driver 130.

Herein, the gate start pulse (GSP) controls an operation start timing of one or more gate circuits of the gate driver 130. The gate shift clock (GSC) is a clock signal commonly input to the one or more gate circuits to control a shift timing of a scanning signal (e.g., gate pulse). The gate output enable signal (GOE) designates timing information of the one or more gate circuits.

Also, the timing controller 140 outputs various data control signals DCS including a source start pulse (SSP), a source sampling clock (SSC) and a source output enable signal (SOE) to control the data driver 120.

Herein, the source start pulse (SSP) controls a data sampling start timing of one or more data circuits of the data driver 120. The source sampling clock (SSC) is a clock signal of each data circuit to control a data sampling timing. The source output enable signal (SOE) controls an output timing of the data driver 120.

Further, the timing controller 140 converts the image data received from the external system into data signal Data suitable for the data compensation unit 160 and outputs the data signal Data. Thus, the timing controller 140 controls data driving at a proper time according to the scan.

The timing controller 140 may be disposed on a control printed circuit board connected to a source printed circuit board to which the data driver 120 is bonded through a connection medium such as a flexible flat cable (FFC) or a flexible printed circuit (FPC).

The gate driver 130 sequentially supplies gate voltages to the gate lines GL according to the control of the timing controller 140.

The gate driver 130 may be located only on one side of the display panel 110 according to a driving method, or may be located on both sides of the display panel 110 if necessary.

The gate driver 130 may be connected to bonding pads of the display panel 110 by a tape automated bonding (TAB) method or a chip on glass (COG) method. Otherwise, the gate driver 130 may be implemented by a gate in panel (GIP) type to be directly disposed on the display panel 110. In some cases, the gate driver 130 may be integrated and disposed on the display panel 110.

The gate driver 130 may include a shift register, a level shifter, and the like.

The threshold voltage sensor 150 is configured to sense a threshold voltage of a light emitting element disposed on each pixel PX.

That is, the threshold voltage sensor 150 is connected to the light emitting element disposed on each pixel PX through a sensing line SL and senses a voltage applied to an electrode of the light emitting element to sense a threshold voltage of the light emitting element.

Further, the threshold voltage sensor 150 outputs a variation AVoled in the threshold voltage of the light emitting element caused by the degradation of the light emitting element to the data compensation unit 160.

To this end, the threshold voltage sensor 150 may include a differential amplifier configured to extract the variation AVoled in the threshold voltage of the light emitting element caused by the degradation of the light emitting element. Also, the threshold voltage sensor 150 may include an analog digital converter (ADC) configured to convert an analog voltage to a digital signal.

Particularly, in the display device 100 according to an embodiment of the present disclosure, the threshold voltage sensor 150 can output a variation AVoled in a threshold voltage of a white light emitting element disposed in a white sub-pixel to the data compensation unit 160.

The data compensation unit 160 compensates for the data signal Data depending on the degree of degradation of the light emitting element and outputs compensated data signal Cdata.

Specifically, the data compensation unit 160 determines the degree of degradation of the light emitting element based on the threshold voltage variation AVoled. Then, the data compensation unit 160 compensates for the data signal Data by applying a gain depending on the degree of degradation of the light emitting element and outputs the compensated data signal Cdata to the data driver 120.

That is, the data compensation unit 160 determines a gain of the data signal Data based on the threshold voltage variation AVoled output from the threshold voltage sensor 150. Then, the data compensation unit 160 applies the gain to the data signal Data and outputs the compensated data signal Cdata.

For example, the data signal Data may be divided into red data signal to be applied to a red sub-pixel, green data signal to be applied to a green sub-pixel, blue data signal to be applied to a blue sub-pixel and white data signal to be applied to a white sub-pixel.

Also, the data compensation unit 160 generates red compensated data signal by applying the red gain to the red data signal, and green compensated data signal by applying the green gain to the green data signal. Further, the data compensation unit 160 generates blue compensated data signal by applying the blue gain to the blue data signal, and white compensated data signal by applying the white gain to the white data signal.

Further, in some embodiments, the compensated data signal (Compensated Data) Cdata may be defined by integrating the red compensated data signal, the green compensated data signal, the blue compensated data signal and the white compensated data signal.

The data driver 120 converts the compensated data signal Cdata received from the data compensation unit 160 into an analog type data voltage Vdata and outputs the data voltage Vdata to the data lines DL.

The data driver 120 may be connected to the bonding pads of the display panel 110 by the TAB method or the COG method. Otherwise, the data driver 120 may be directly disposed on the display panel 110. In some cases, the data driver 120 may be integrated and disposed on the display panel 110.

Also, the data driver 120 may be implemented by a chip on film (COF) method. In this case, one end of the data driver 120 may be bonded to at least one source printed circuit board and the other end may be bonded to the display panel 110.

The data driver 120 may include a logic unit including various circuits, such as a level shifter and a latch unit, a digital analog converter (DAC) and an output buffer.

Also, the data driver 120 may include a power controller disposed on the control printed circuit board. The power controller is configured to supply various voltages or currents to the display panel 110, the data driver 120, the gate driver 130, the timing controller 140, the threshold voltage sensor 150 and the data compensation unit 160 or control various voltages or currents to be supplied. The power controller may be referred to as a power management IC (PMIC).

Hereinafter, referring to FIG. 2, a circuit configuration of a pixel PX of the display device according to an embodiment of the present disclosure will be described in detail.

Figure 2:
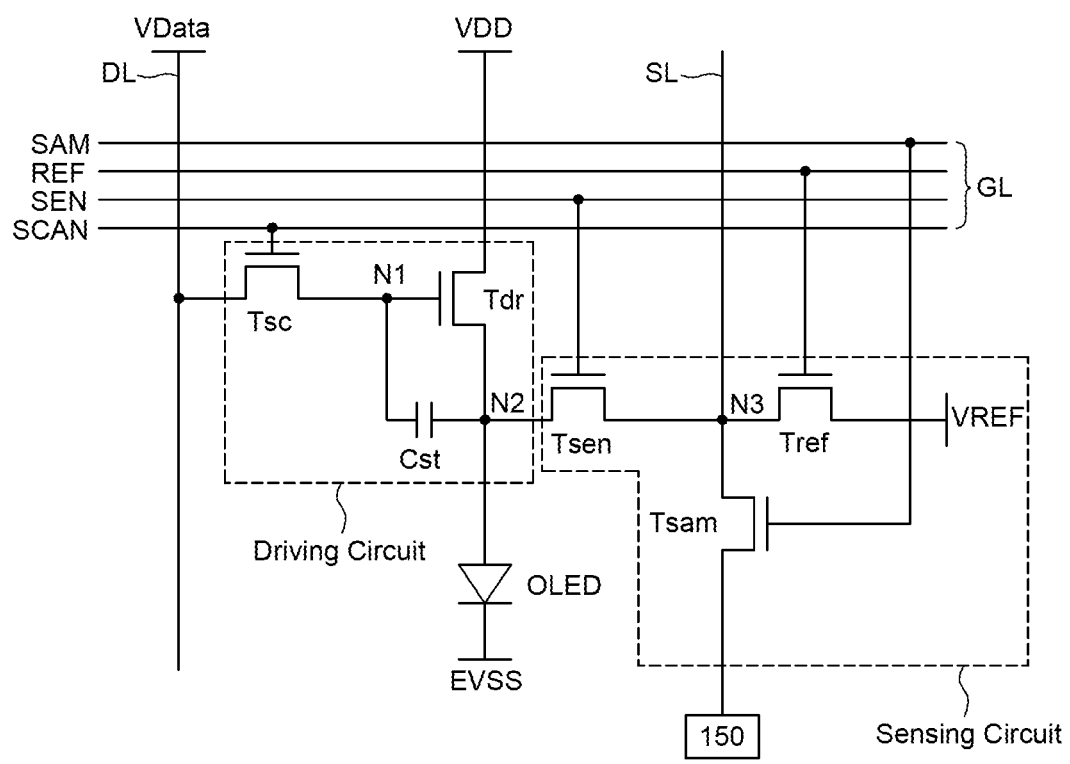
FIG. 2 is a circuit diagram illustrating a pixel of the display device according to an embodiment of the present disclosure.

FIG. 2 is a circuit diagram illustrating a pixel of the display device according to an embodiment of the present disclosure.

As illustrated in FIG. 2, each pixel PX includes an organic light emitting diode OLED which is a light emitting element and a driving circuit configured to drive the organic light emitting diode OLED. Also, the pixel PX includes a sensing circuit configured to sense a threshold voltage Voled of the organic light emitting diode OLED.

The driving circuit includes a driving transistor Tdr, a scan transistor Tsc and a storage capacitor Cst.

The scan transistor Tsc applies a data voltage Vdata to a first node N1 in response to a scan signal SCAN. In the scan transistor Tsc, the scan signal SCAN is applied to a gate electrode and the data voltage Vdata is applied to a first electrode, and a second electrode is connected to the first node N1. Herein, the first node N1 may correspond to a gate electrode of the driving transistor Tdr. Thus, if the scan signal SCAN has a turn-on level, the scan transistor Tsc may be turned on and the data voltage Vdata may be applied to the first node N1.

The driving transistor Tdr supplies a driving current to the organic light emitting diode OLED to drive the organic light emitting diode OLED. In the driving transistor Tdr, the gate electrode is connected to the first node N1 and a high-potential driving voltage VDD is applied to a first electrode, and a second electrode is connected to a second node N2. Further, the second node N2 is connected to an electrode of the organic light emitting diode OLED. Thus, a driving current is determined based on a gate-source voltage Vgs of the driving transistor Tdr. Therefore, it is possible to control the organic light emitting diode OLED.

The storage capacitor Cst is connected between the first node N1 which is the gate electrode of the driving transistor Tdr and the second node N2 which is the second electrode of the driving transistor Tdr. The storage capacitor Cst maintains a gate-source voltage Vgs of the driving transistor Tdr for one frame so that the organic light emitting diode OLED can maintain uniform luminance for one frame.

The sensing circuit includes a sensing transistor Tsen, a reference transistor Tref and a sampling transistor Tsam.

The sensing transistor Tsen electrically connects the second node N2 and a third node N3 in response to a sensing signal SEN. In the sensing transistor Tsen, the sensing signal SEN is applied to a gate electrode, the second node N2 is connected to a first electrode, and a second electrode is connected to the third node N3. Further, the second node N2 is connected to an electrode of the organic light emitting diode OLED and the third node N3 is connected to a sensing line SL. Thus, if the sensing signal SEN has a turn-on level, the sensing transistor Tsen may be turned on and an electrode of the organic light emitting diode OLED may be connected to the sensing line SL.

The reference transistor Tref applies a reference voltage VREF to the third node N3 in response to a reference signal REF. In the reference transistor Tref, the reference signal REF is applied to a gate electrode, the reference voltage VREF is applied to a first electrode, and a second electrode is connected to the third node N3. Thus, if the reference signal REF has a turn-on level, the reference transistor Tref may be turned on and the reference voltage VREF may be applied to the third node N3.

The sampling transistor Tsam may sample the voltage applied to the third node N3 in response to a sampling signal SAM. In the sampling transistor Tsam, the sampling signal SAM is applied to a gate electrode, the third node N3 is connected to a first electrode, and a second electrode is connected to the threshold voltage sensor 150. Thus, if the sampling signal SAM has a turn-on level, the sampling transistor Tsam may be turned on and the voltage applied to the third node N3 may be sampled by the threshold voltage sensor 150.

The sensing transistor Tsen, the reference transistor Tref and the sampling transistor Tsam constituting the sensing circuit serve as a switch and thus may be substituted by a circuit element, such as a diode, serving as a switch.

Hereinafter, a method for sensing a threshold voltage of the organic light emitting diode of the display device according to an embodiment of the present disclosure will be described with reference to FIG. 3 and FIG. 4A through FIG. 4C.

Figure 3:
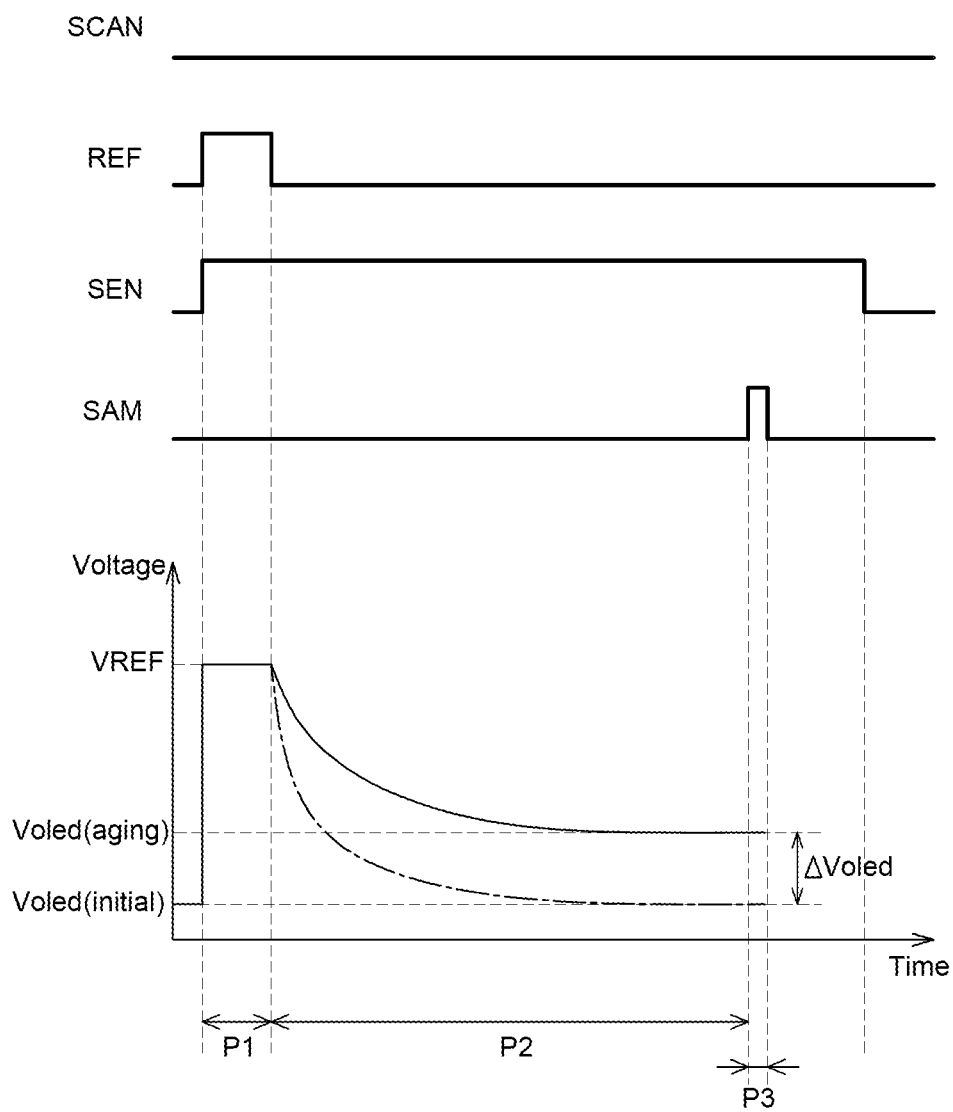
FIG. 3 is a graph showing a voltage of an electrode in an organic light emitting diode of the display device according to an embodiment of the present disclosure.

FIG. 3 is a graph showing voltages of an electrode in an organic light emitting diode of the display device according to an embodiment of the present disclosure.

Figure 4A:
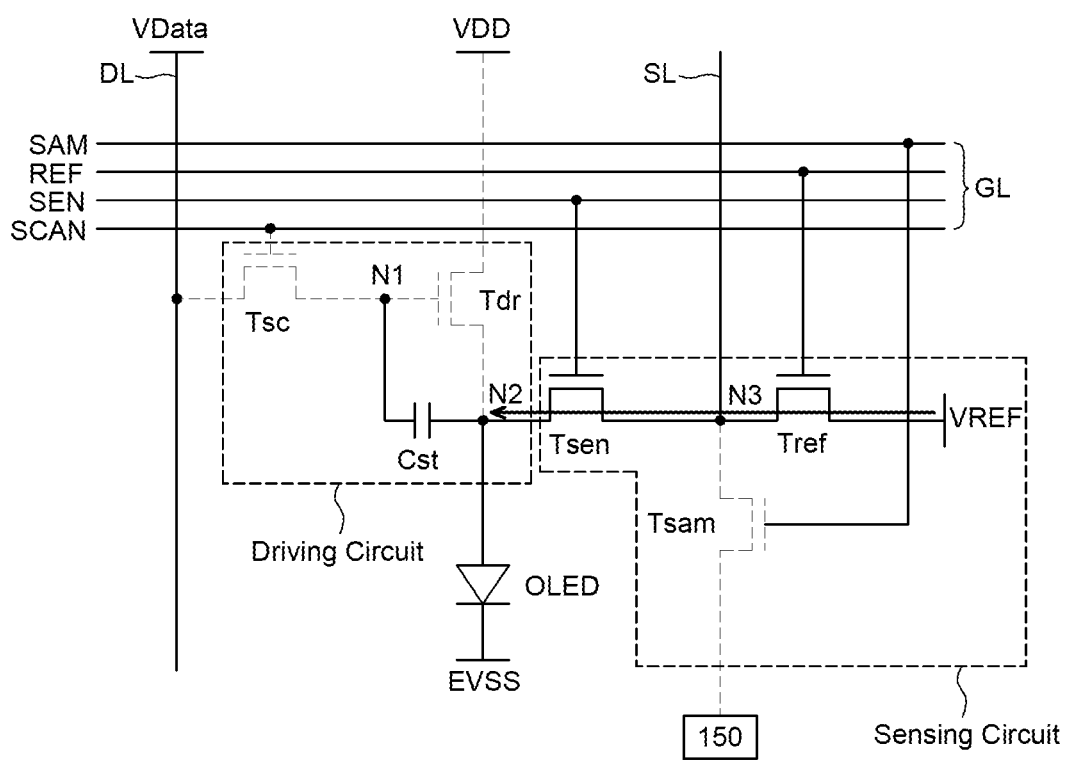
FIG. 4A through FIG. 4C are circuit diagrams provided to explain a method for sensing a threshold voltage of the organic light emitting diode of the display device according to an embodiment of the present disclosure.
Figure 4B:
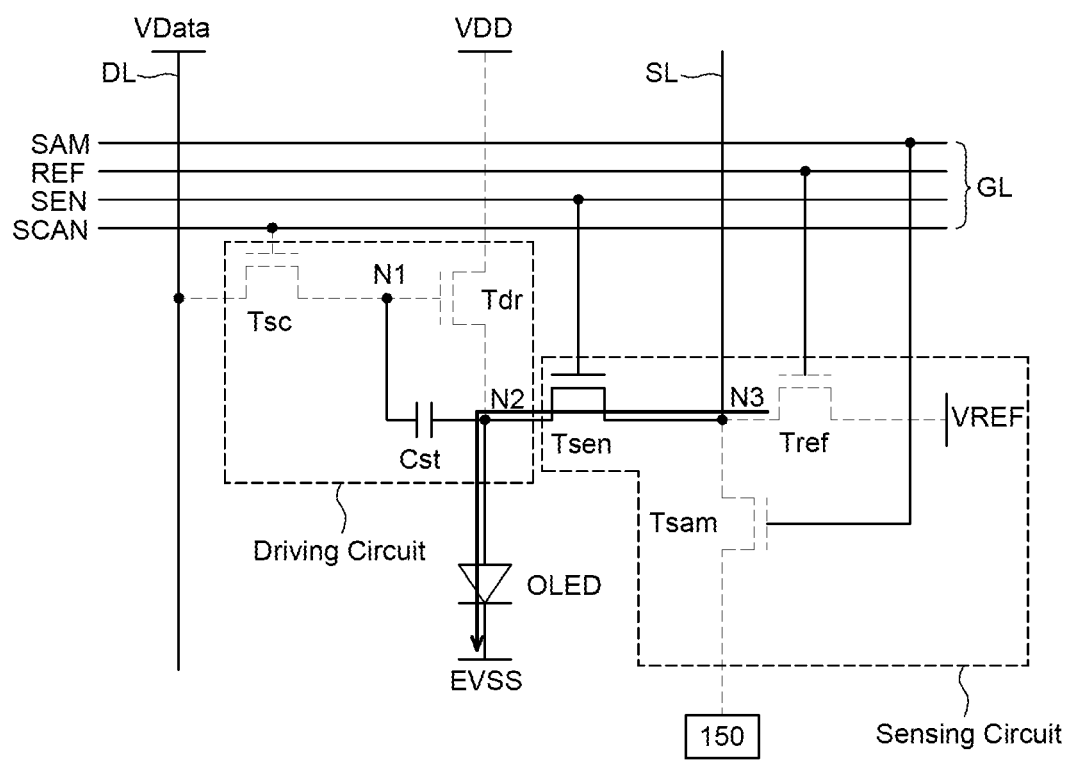
Figure 4C:
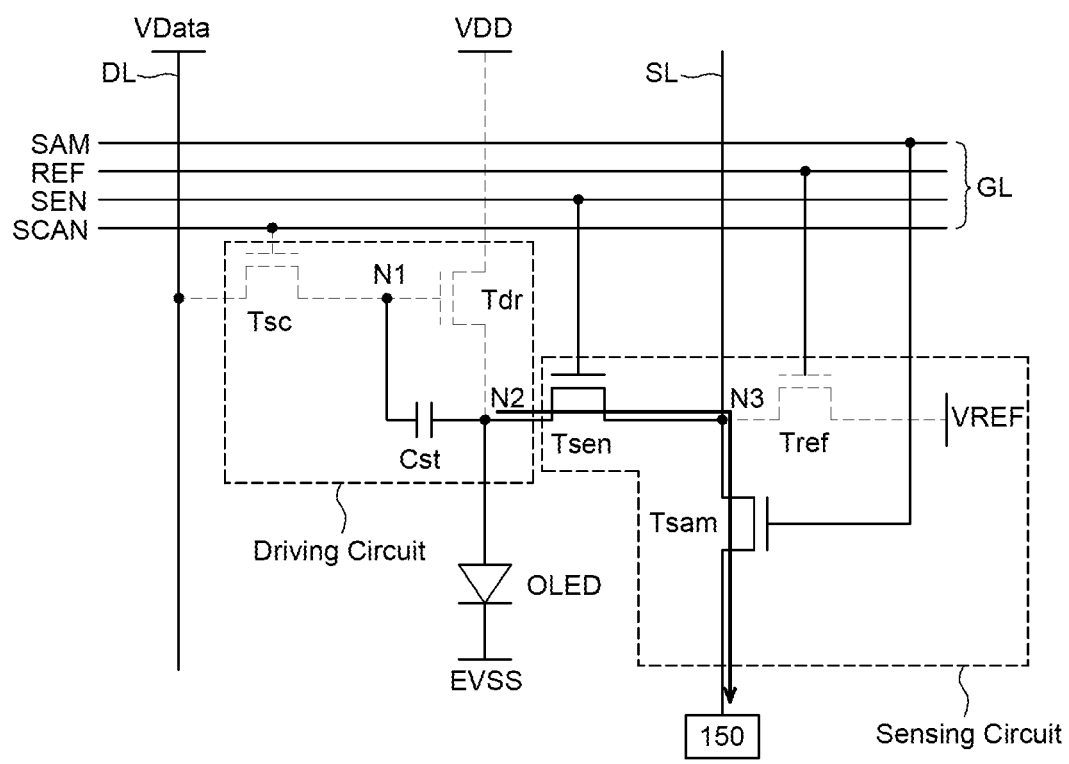

FIG. 4A through FIG. 4C are circuit diagrams provided to explain a method for sensing a threshold voltage of the organic light emitting diode of the display device according to an embodiment of the present disclosure.

As illustrated in FIG. 3, during a first period P1, the scan signal SCAN has a turn-off level, the reference signal REF has a turn-on level, the sensing signal SEN has a turn-on level and the sampling signal SAM has a turn-off level.

Thus, referring to FIG. 4A, the sensing transistor Tsen and the reference transistor Tref are turned on and both the second node N2 and the third node N3 are charged with the reference voltage VREF.

The above-described reference voltage VREF may be higher than the threshold voltage Voled of the organic light emitting diode OLED.

Then, as illustrated in FIG. 3, during a second period P2, the scan signal SCAN has a turn-off level, the reference signal REF has a turn-off level, the sensing signal SEN has a turn-on level and the sampling signal SAM has a turn-off level.

Thus, referring to FIG. 4B, only the sensing transistor Tsen is turned on and the second node N2 and the third node N3 are electrically connected to each other. The reference voltage VREF charged in the second node N2 and the third node N3 is higher than the threshold voltage Voled of the organic light emitting diode OLED. Therefore, through the organic light emitting diode OLED, the reference voltage VREF applied to the second node N2 and the third node N3 may be discharged to the threshold voltage Voled of the organic light emitting diode OLED. Further, if the reference voltage VREF applied to the second node N2 and the third node N3 is equal to the threshold voltage Voled of the organic light emitting diode OLED, a current cannot flow the organic light emitting diode OLED. Thus, the voltage of the second node N2 and the third node N3 is saturated to the threshold voltage Voled of the organic light emitting diode OLED.

In this regard, the organic light emitting diode OLED is degraded as aging progresses. A threshold voltage Voled (aging) of the organic light emitting diode OLED in an aging state may be higher than a threshold voltage Voled(initial) of the organic light emitting diode OLED in an initial state.

Then, as illustrated in FIG. 3, during a third period P3, the scan signal SCAN has a turn-off level, the reference signal REF has a turn-off level, the sensing signal SEN has a turn-on level and the sampling signal SAM has a turn-on level.

Thus, referring to FIG. 4C, the sensing transistor Tsen and the sampling transistor Tsam are turned on. The threshold voltage Voled of the organic light emitting diode OLED charged in the second node N2 and the third node N3 may be sampled by the threshold voltage sensor 150 through the sensing line SL. Therefore, the threshold voltage sensor 150 may sense each of the threshold voltage Voled(initial) of the organic light emitting diode OLED in the initial state and the threshold voltage Voled(aging) of the organic light emitting diode OLED in the aging state. Then, the threshold voltage sensor 150 may generate a threshold voltage variation ΔVoled corresponding to a difference between the threshold voltage Voled(initial) of the organic light emitting diode OLED in the initial state and the threshold voltage Voled (aging) of the organic light emitting diode OLED in the aging state.

Hereinafter, a data compensation unit of the display device according to an embodiment of the present disclosure will be described in detail with reference to FIG. 5, FIG. 6A and FIG. 6B.

Figure 5:
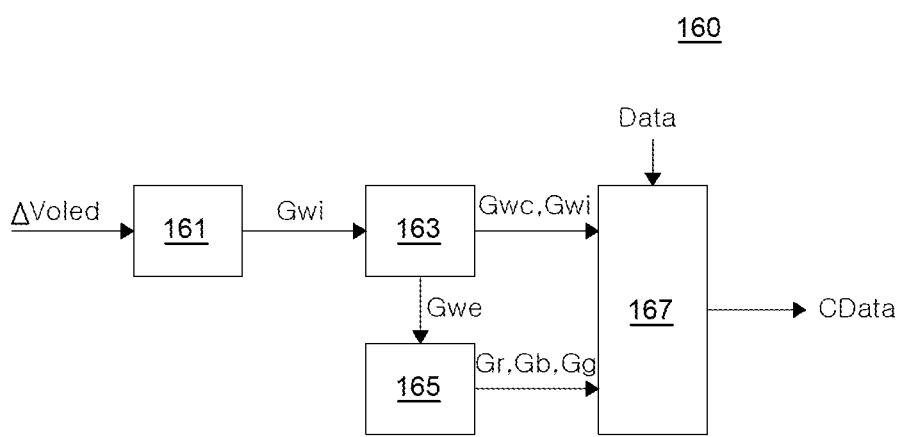
FIG. 5 is a block diagram illustrating a data compensation unit of the display device according to an embodiment of the present disclosure.

FIG. 5 is a block diagram illustrating a data compensation unit of the display device according to an embodiment of the present disclosure.

Figure 6A:
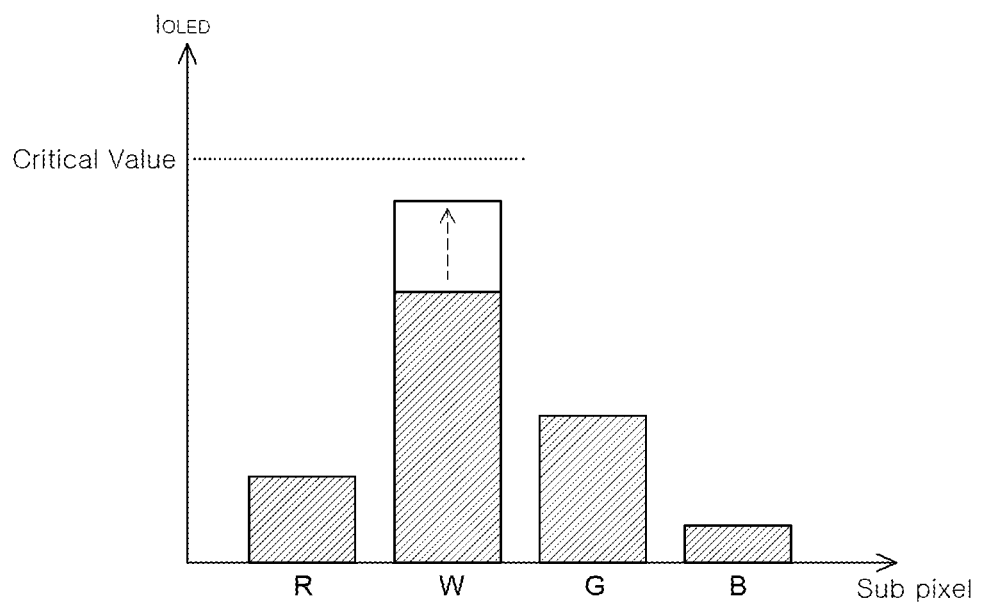
FIG. 6A and FIG. 6B are graphs each showing a driving current depending on compensated data signal in the display device according to an embodiment of the present disclosure.
Figure 6B:
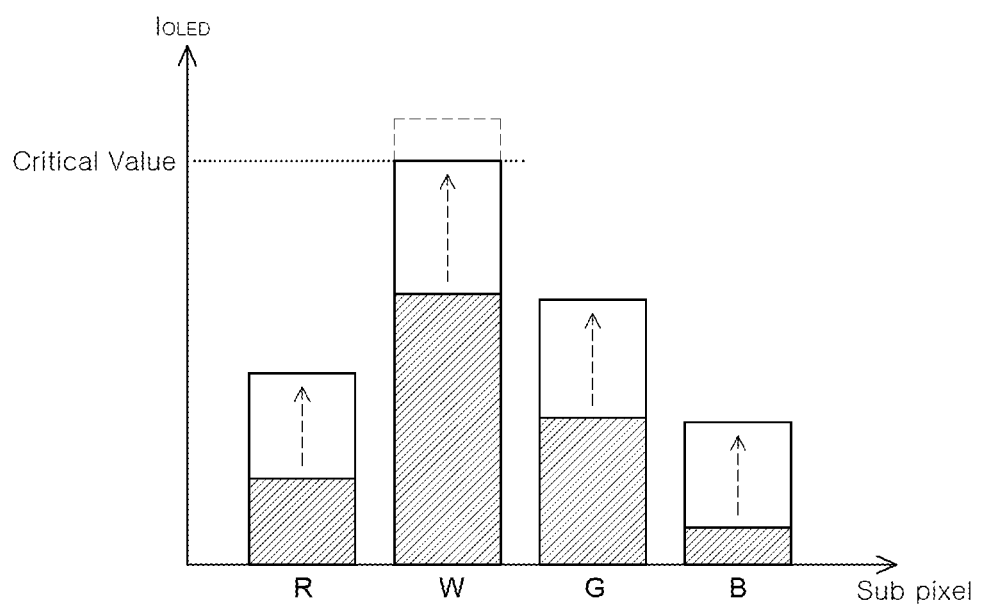

FIG. 6A and FIG. 6B are graphs each showing a driving current depending on compensated data signal in the display device according to an embodiment of the present disclosure.

Specifically, FIG. 6A is a graph showing a driving current $I_{OLED}$ in response to the compensated data signal Cdata if an initial white gain Gwi is equal to or lower than a critical white gain Gwc. Also, FIG. 6B is a graph showing a driving current $I_{OLED}$ in response to the compensated data signal Cdata if the initial white gain Gwi is higher than the critical white gain Gwc.

As illustrated in FIG. 5, the data compensation unit 160 includes an initial white gain calculation circuit 161, a gain analysis circuit 163, a gain conversion circuit 165 and a gain application circuit 167. The initial white gain calculation circuit 161 (which may be referred to herein as the initial white gain calculation unit 161), the gain analysis circuit 163 (which may be referred to herein as the gain analysis unit 163), the gain conversion circuit 165 (which may be referred to herein as the gain conversion unit 165), the gain application circuit 167 (which may be referred to herein as the gain application unit 167) may include any electrical circuitry, features, components, an assembly of electronic components or the like configured to perform the various operations of the initial white gain calculation features of the initial white gain calculation unit 161, the various operations of the gain analysis features of the gain analysis unit 163, the various operations of the gain conversion features of the gain conversion unit 165, the various operations of the gain application features of the gain application unit 167 as described herein.

The initial white gain calculation unit 161 calculates an initial white gain Gwi based on a threshold voltage variation ΔVoled of a white light emitting element.

Specifically, the initial white gain calculation unit 161 calculates the initial white gain Gwi to compensate for the degradation of the white light emitting element based on the threshold voltage variation ΔVoled of the white light emitting element caused by the degradation of the white light emitting element. Then, the initial white gain calculation unit 161 calculates the initial white gain Gwi, and outputs the initial white gain Gwi to the gain analysis unit 163.

To this end, the initial white gain calculation unit 161 may include a first look-up table that stores the relationship between the threshold voltage variation ΔVoled of the white light emitting element and the initial white gain Gwi.

The gain analysis unit 163 compares the initial white gain Gwi with a critical white gain Gwc to calculate an excess white gain Gwe which is higher than the critical white gain Gwc among the initial white gains Gwi.

The critical white gain Gwc refers to a limit of gains allowable by the white light emitting element. Thus, the initial white gain Gwi may be higher than the critical white gain Gwc. In this case, if the initial white gain Gwi is applied to white data signal Data as it is, a driving current $I_{OLED}$ higher than a critical value flows to the white light emitting element. Thus, the white light emitting element may be applied with excessive stress.

Specifically, referring to FIG. 6A, the initial white gain Gwi may be equal to or lower than the critical white gain Gwc. In this case, even if the initial white gain Gwi is applied to the white data signal Data, a driving current $I_{OLED}$ equal to or lower than the critical value flows to the white light emitting element disposed in a white sub-pixel W. Thus, the white light emitting element is not applied with excessive stress.

Thus, if the initial white gain Gwi is equal to or lower than the critical white gain Gwc, the gain analysis unit 163 outputs the initial white gain Gwi to the gain application unit 167.

On the contrary, referring to FIG. 6B, the initial white gain Gwi may be higher than the critical white gain Gwc. In this case, if the initial white gain Gwi is applied to the white data signal Data as it is, the driving current $I_{OLED}$ higher than the critical value flows to the white light emitting element. Thus, the white light emitting element may be applied with excessive stress.

Thus, if the initial white gain Gwi is higher than the critical white gain Gwc, the gain analysis unit 163 separates the initial white gain Gwi into the critical white gain Gwc and the excess white gain Gwe. The above-described excess white gain Gwe corresponds a difference between the initial white gain Gwi and the critical white gain Gwc.

Then, the gain analysis unit 163 outputs the critical white gain Gwc to the gain application unit 167 and the excess white gain Gwe to the gain conversion unit 165.

For example, if the initial white gain Gwi is 1.32 and the critical white gain Gwc is 1.2, the gain analysis unit 163 may calculate the excess white gain Gwe as 1.1. That is, the initial white gain Gwi can be obtained by multiplying the critical white gain Gwc by the excess white gain Gwe.

Figure 7:
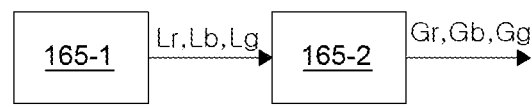
FIG. 7 is a block diagram illustrating a gain conversion unit of the display device according to an embodiment of the present disclosure.

FIG. 7 is a block diagram illustrating a gain conversion unit of the display device according to an embodiment of the present disclosure.

If the initial white gain Gwi is higher than the critical white gain Gwc, the gain conversion unit 165 converts the excess white gain Gwe into a red gain Gr, a green gain Gg and a blue gain Gb.

Specifically, the gain conversion unit 165 includes an RGB luminance calculation unit 165-1 configured to calculate a red luminance Lr, a green luminance Lg and a blue luminance Lb to be compensated for by using red coordinates $(x_r, y_r, z_r)$, green coordinates $(x_g, y_g, z_g)$, blue coordinates $(x_b, y_b, z_b)$ and white coordinates $(x_n, y_n, z_n)$. The gain conversion unit 165 also includes an RGB gain calculation unit 165-2 configured to calculate the red gain Gr, the green gain Gg and the blue gain Gb based on the red luminance Lr, the green luminance Lg and the blue luminance Lb.

As described above, the white coordinates $(x_n, y_n, z_n)$ are color coordinates to be obtained by applying the excess white gain Gwe. The red coordinates $(x_r, y_r, z_r)$, the green coordinates $(x_g, y_g, z_g)$ and the blue coordinates $(x_b, y_b, z_b)$ are unique color coordinates applied to each display panel 110.

The RGB luminance calculation unit 165-1 calculates the red luminance Lr, the green luminance Lg and the blue luminance Lb so as to correspond to the white coordinates to be obtained by applying the excess white gain Gwe.

Specifically, the RGB luminance calculation unit 165-1 may calculate the red luminance Lr, the green luminance Lg and the blue luminance Lb to be compensated for by using the red coordinates $(x_r, y_r, z_r)$, green coordinates $(x_g, y_g, z_g)$ and blue coordinates $(x_b, y_b, z_b)$ which are unique for the display panel 110 and the white coordinates $(x_n, y_n, z_n)$ according to Equation 1.

$$\begin{bmatrix} L_r \\ L_g \\ L_b \end{bmatrix} = \begin{bmatrix} (x_r/y_r) & (x_g/y_g) & (x_b/y_b) \\ 1 & 1 & 1 \\ (z_r/y_r) & (z_g/y_g) & (z_b/y_b) \end{bmatrix}^{-1} \begin{bmatrix} (x_n/y_n) \\ 1 \\ (z_n/y_n) \end{bmatrix} \quad \text{[Equation 1]}$$

The RGB gain calculation unit 165-2 calculates the red gain Gr, the green gain Gg and the blue gain Gb to output the red luminance Lr, the green luminance Lg and the blue luminance Lb.

Specifically, the RGB gain calculation unit 165-2 calculates a ratio between an initial red luminance and the red luminance Lr output by the RGB luminance calculation unit 165-1 as the red gain Gr. Also, the RGB gain calculation unit 165-2 calculates a ratio between an initial green luminance and the green luminance Lg output by the RGB luminance calculation unit 165-1 as the green gain Gg. Further, the RGB gain calculation unit 165-2 calculates a ratio between an initial blue luminance and the blue luminance Lb output by the RGB luminance calculation unit 165-1 as the blue gain Gb.

Through the above-described series of operations, the gain conversion unit 165 converts the excess white gain Gwe into the red gain Gr, the green gain Gg and the blue gain Gb by using the red coordinates $(x_r, y_r, z_r)$, the green coordinates $(x_g, y_g, z_g)$, the blue coordinates $(x_b, y_b, z_b)$ and the white coordinates $(x_n, y_n, z_n)$.

The gain application unit 167 outputs the compensated data signal Cdata by applying a gain to the data signal Data.

Specifically, if the initial white gain Gwi is equal to or lower than the critical white gain Gwc, only the initial white gain Gwi is input to the gain application unit 167. Thus, if the initial white gain Gwi is equal to or lower than the critical white gain Gwc, the gain application unit 167 applies the initial white gain Gwi to white data signal to output white compensated data signal.

On the contrary, if the initial white gain Gwi is higher than the critical white gain Gwc, the red gain Gr, the green gain Gg, the blue gain Gb and the critical white gain Gwc are input to the gain application unit 167. Thus, if the initial white gain Gwi is higher than the critical white gain Gwc, the gain application unit 167 applies the red gain Gr to red data signal to output red compensated data signal. Also, the gain application unit 167 applies the green gain Gg to green data signal to output green compensated data signal and applies the blue gain Gb to blue data signal to output blue compensated data signal. Further, the gain application unit 167 applies the critical white gain Gwc to white data signal to output white compensated data signal.

As described above, even if the initial white gain Gwi is higher the critical white gain Gwc, if the initial white gain Gwi is applied to the white data signal Data as it is, the driving current $I_{OLED}$ higher than the critical value flows to the white light emitting element. Thus, the white light emitting element may be applied with excessive stress.

As illustrated in FIG. 6B, in the display device according to an embodiment of the present disclosure, if the initial white gain Gwi is higher than the critical white gain Gwc, the critical white gain Gwc lower than the initial white gain Gwi is applied to the white data signal Data. Thus, the driving current $I_{OLED}$ higher than the critical value does not flow to the white light emitting element.

Further, in the display device according to an embodiment of the present disclosure, the excess white gain Gwe is converted into the red gain Gr, the green gain Gg and the blue gain Gb. Thus, the red light emitting element, the green light emitting element and the blue light emitting element may output luminance corresponding to the excess white gain Gwe instead of the white light emitting element.

That is, instead of a driving current $I_{OLED}$ of the white light emitting element which is higher than the critical value and does not increase, a driving current $I_{OLED}$ of the red light emitting element, a driving current $I_{OLED}$ of the green light emitting element and a driving current $I_{OLED}$ of the blue light emitting element may increase.

To sum up, in the display device according to an embodiment of the present disclosure, it is possible to solve image sticking caused by the degradation of white light emitting elements. Also, it is possible to reduce or minimize stress applied to the white light emitting elements. Therefore, it is possible to improve the reliability of the white light emitting elements.

Therefore, the display device according to an embodiment of the present disclosure can display an image which does not leave image sticking and also improve the lifetime of light emitting elements.

Hereinafter, a display device 200 according to another embodiment of the present disclosure will be described in detail with reference to FIG. 8. The display device 200 according to another embodiment of the present disclosure is substantially the same as the display device 100 according to an embodiment of the present disclosure except a color temperature controller 266. Therefore, the color temperature controller 266 will be described in detail. Some parts of the display device 200 according to another embodiment of the present disclosure which are the same as those of the display device 100 according to an embodiment of the present disclosure will be denoted by the same reference numerals, respectively.

Figure 8:
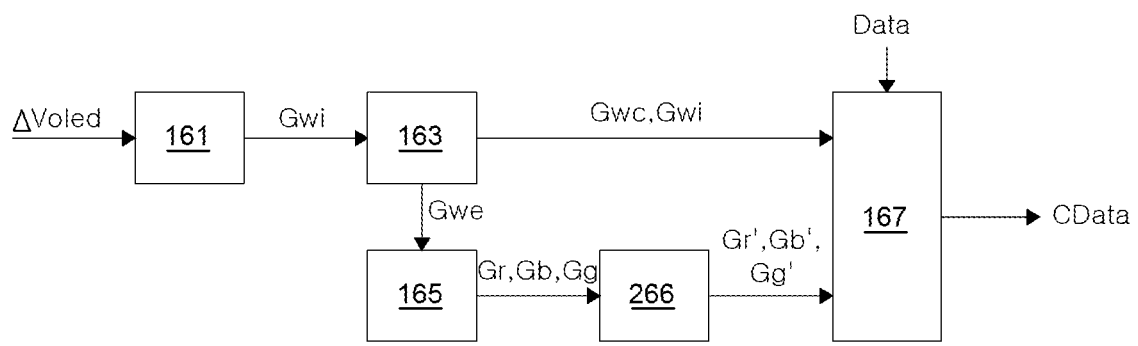
FIG. 8 is a block diagram illustrating a data compensation unit of a display device according to another embodiment of the present disclosure.

FIG. 8 is a block diagram illustrating a data compensation unit of a display device according to another embodiment of the present disclosure.

As illustrated in FIG. 8, a data compensation unit 260 includes the initial white gain calculation unit 161, the gain analysis unit 163, the gain conversion unit 165, the color temperature controller 266 and the gain application unit 167.

The color temperature controller 266 corrects the red gain Gr, the green gain Gg and the blue gain Gb so that a color temperature of the display panel can be maintained constant or substantially constant. Then, the color temperature controller 266 outputs the corrected gains to the gain application unit 167.

Specifically, if the white light emitting element is degraded, if the driving current $I_{OLED}$ of the white light emitting element is increased by applying a white gain to white data, a color temperature of the entire display panel 110 may be distorted. Thus, the color temperature controller 266 may correct the red gain Gr, the green gain Gg and the blue gain Gb and control the driving current $I_{OLED}$ of the red light emitting element, the driving current $I_{OLED}$ of the green light emitting element and the driving current $I_{OLED}$ of the blue light emitting element to correct the distorted color temperature.

That is, the color temperature controller 266 may convert the red gain Gr into a compensated red gain Gr', the green gain Gg into a compensated green gain Gg' and the blue gain Gb into a compensated blue gain Gb' so that the color temperature of the display panel 110 can be maintained constant or substantially constant. Then, the color temperature controller 266 may output the converted gains to the gain application unit 167.

To this end, the color temperature controller 266 may include a second look-up table that stores the relationship between the red gain Gr, the green gain Gg and the blue gain Gb and a variation in the color temperature.

Then, the gain application unit 167 applies the compensated red gain Gr' to red data signal to output red compensated data signal. Also, the gain application unit 167 applies the compensated green gain Gg' to green data signal to output green compensated data signal. Further, the gain application unit 167 applies the compensated blue gain Gb' to blue data signal to output blue compensated data signal. Furthermore, the gain application unit 167 applies the critical white gain Gwc to white data signal to output white compensated data signal.

Therefore, in the display device 200 according to another embodiment of the present disclosure, it is possible to control the color temperature which may be distorted by increasing the driving current $I_{OLED}$ of the white light emitting element.

As a result, the display device according to an embodiment of the present disclosure can improve the image quality by applying a predetermined image sticking compensation method to a color temperature.

Hereinafter, a driving method of a display device according to an embodiment of the present disclosure will be described in detail with reference to FIG. 9. The driving method of a display device according to an embodiment of the present disclosure will be described with reference to the display device 100 according to an embodiment of the present disclosure.

Figure 9:
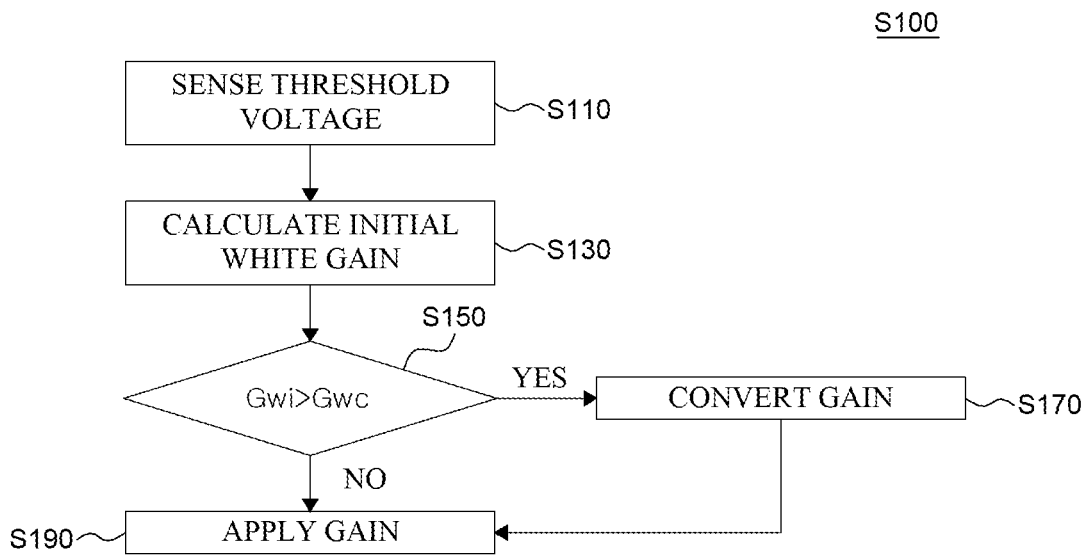
FIG. 9 is a flowchart provided to explain a driving method of a display device according to an embodiment of the present disclosure.

FIG. 9 is a flowchart provided to explain the driving method of a display device according to an embodiment of the present disclosure.

As shown in FIG. 9, a driving method S100 of the display device according to an embodiment of the present disclosure includes a threshold voltage sensing process S110, an initial white gain calculation process S130, a gain analysis process S150, a gain conversion process S170 and a gain application process S190.

In the threshold voltage sensing process S110, a threshold voltage of a light emitting element disposed in each pixel PX is sensed to calculate a variation ΔVoled in the threshold voltage of the light emitting element caused by the degradation of the light emitting element.

Specifically, as illustrated in FIG. 3, in the threshold voltage sensing process S110, each of the threshold voltage Voled(initial) of the organic light emitting diode OLED in the initial state and the threshold voltage Voled(aging) of the organic light emitting diode OLED in the aging state may be sensed. Then, the threshold voltage variation ΔVoled corresponding to a difference between the threshold voltage Voled(initial) of the organic light emitting diode OLED in the initial state and the threshold voltage Voled(aging) of the organic light emitting diode OLED in the aging state may be generated.

Then, in the initial white gain calculation process S130, the initial white gain Gwi may be calculated based on a threshold voltage variation ΔVoled of a white light emitting element.

Specifically, in the initial white gain calculation process S130, the initial white gain Gwi may be calculated to compensate for the degradation of the white light emitting element based on the threshold voltage variation ΔVoled of the white light emitting element caused by the degradation of the white light emitting element.

Then, in the gain analysis process S150, the initial white gain Gwi may be compared with the critical white gain Gwc to calculate the excess white gain Gwe which is higher than the critical white gain Gwc among the initial white gains Gwi.

Specifically, referring to FIG. 6A, the initial white gain Gwi may be equal to or lower than the critical white gain Gwc. In this case, even if the initial white gain Gwi is applied to the white data signal Data, the driving current $I_{OLED}$ equal to or lower than the critical value flows to the white light emitting element disposed in a white sub-pixel W. Thus, the white light emitting element is not applied with excessive stress.

Thus, if the initial white gain Gwi is equal to or lower than the critical white gain Gwc, there is no need to convert the initial white gain Gwi in the gain analysis process S150.

On the contrary, referring to FIG. 6B, the initial white gain Gwi may be higher than the critical white gain Gwc. In this case, if the initial white gain Gwi is applied to the white data signal Data as it is, the driving current $I_{OLED}$ higher than the critical value flows to the white light emitting element. Thus, the white light emitting element may be applied with excessive stress.

Thus, in the gain analysis process S150, if the initial white gain Gwi is higher than the critical white gain Gwc, the gain analysis unit 163 separates the initial white gain Gwi into the critical white gain Gwc and the excess white gain Gwe. The excess white gain Gwe corresponds a difference between the initial white gain Gwi and the critical white gain Gwc.

For example, if the initial white gain Gwi is 1.32 and the critical white gain Gwc is 1.2, the excess white gain Gwe may be calculated as 1.1 in the gain analysis process S150.

That is, the initial white gain Gwi can be obtained by multiplying the critical white gain Gwc by the excess white gain Gwe.

Figure 10:
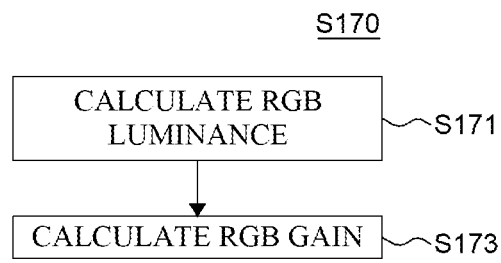
FIG. 10 is a flowchart provided to explain a gain conversion process in the driving method of a display device according to an embodiment of the present disclosure.

FIG. 10 is a flowchart provided to explain a gain conversion process in the driving method of a display device according to an embodiment of the present disclosure.

If the initial white gain Gwi is higher than the critical white gain Gwc, the excess white gain Gwe is converted into the red gain Gr, the green gain Gg and the blue gain Gb in the gain conversion process S170.

Specifically, the gain conversion process S170 includes an RGB luminance calculation process S171 for calculating the red luminance Lr, the green luminance Lg and the blue luminance Lb to be compensated for by using the red coordinates $(x_r, y_r, z_r)$, the green coordinates $(x_g, y_g, z_g)$, the blue coordinates $(x_b, y_b, z_b)$ and the white coordinates $(x_n, y_n, z_n)$. The gain conversion process S170 also includes an RGB gain calculation process S172 for calculating the red gain Gr, the green gain Gg and the blue gain Gb based on the red luminance Lr, the green luminance Lg and the blue luminance Lb.

As described above, the white coordinates $(x_n, y_n, z_n)$ are color coordinates to be obtained by applying the excess white gain Gwe. The red coordinates $(x_r, y_r, z_r)$, the green coordinates $(x_g, y_g, z_g)$ and the blue coordinates $(x_b, y_b, z_b)$ are unique color coordinates applied to each display panel 110.

In the RGB luminance calculation process S171, the red luminance Lr, the green luminance Lg and the blue luminance Lb to be compensated for may be calculated by using the red coordinates $(x_r, y_r, z_r)$, green coordinates $(x_g, y_g, z_g)$ and blue coordinates $(x_b, y_b, z_b)$ which are unique for the display panel 110 and the white coordinates $(x_n, y_n, z_n)$ according to Equation 1.

$$\begin{bmatrix} L_r \\ L_g \\ L_b \end{bmatrix} = \begin{bmatrix} (x_r/y_r) & (x_g/y_g) & (x_b/y_b) \\ 1 & 1 & 1 \\ (z_r/y_r) & (z_g/y_g) & (z_b/y_b) \end{bmatrix}^{-1} \begin{bmatrix} (x_n/y_n) \\ 1 \\ (z_n/y_n) \end{bmatrix} \quad \text{[Equation 1]}$$

In the RGB gain calculation process S172, the red gain Gr, the green gain Gg and the blue gain Gb are calculated to output the red luminance Lr, the green luminance Lg and the blue luminance Lb.

Specifically, in the RGB gain calculation process S172, a ratio between an initial red luminance and the red luminance Lr output in the RGB luminance calculation process S171 is calculated as the red gain Gr. Also, in the RGB gain calculation process S172, a ratio between an initial green luminance and the green luminance Lg output in the RGB luminance calculation process S171 is calculated as the green gain Gg. Further, in the RGB gain calculation process S172, a ratio between an initial blue luminance and the blue luminance Lb output in the RGB luminance calculation process S171 is calculated as the blue gain Gb.

Through the above-described series of operations, the excess white gain Gwe is converted into the red gain Gr, the green gain Gg and the blue gain Gb by using the red coordinates $(x_r, y_r, z_r)$, the green coordinates $(x_g, y_g, z_g)$, the blue coordinates $(x_b, y_b, z_b)$ and the white coordinates $(x_n, y_n, z_n)$ in the gain conversion process S170.

In the gain application process S190, the compensated data signal Cdata are output by applying a gain to the data signal Data.

Specifically, if the initial white gain Gwi is equal to or lower than the critical white gain Gwc, the initial white gain Gwi is applied to white data signal to output white compensated data signal in the gain application process S190.

On the contrary, if the initial white gain Gwi is higher than the critical white gain Gwc, the red gain Gr is applied to red data signal to output red compensated data signal in the gain application process S190. Also, the green gain Gg is applied to green data signal to output green compensated data signal and the blue gain Gb is applied to blue data signal to output blue compensated data signal in the gain application process S190. Further, the critical white gain Gwc is applied to white data signal to output white compensated data signal in the gain application process S190.

As described above, even if the initial white gain Gwi is higher the critical white gain Gwc, if the initial white gain Gwi is applied to the white data signal Data as it is, the driving current $I_{OLED}$ higher than the critical value flows to the white light emitting element. Thus, the white light emitting element may be applied with excessive stress.

As illustrated in FIG. 6B, in the driving method S100 of the display device according to an embodiment of the present disclosure, if the initial white gain Gwi is higher than the critical white gain Gwc, the critical white gain Gwc lower than the initial white gain Gwi is applied to the white data signal Data. Thus, the driving current $I_{OLED}$ higher than the critical value does not flow to the white light emitting element.

Further, in the driving method S100 of the display device according to an embodiment of the present disclosure, the excess white gain Gwe is converted into the red gain Gr, the green gain Gg and the blue gain Gb. Thus, the red light emitting element, the green light emitting element and the blue light emitting element may output luminance corresponding to the excess white gain Gwe instead of the white light emitting element.

That is, instead of the driving current $I_{OLED}$ of the white light emitting element which is higher than the critical value and does not increase, the driving current $I_{OLED}$ of the red light emitting element, the driving current $I_{OLED}$ of the green light emitting element and the driving current $I_{OLED}$ of the blue light emitting element may increase.

To sum up, in the driving method S100 of the display device according to an embodiment of the present disclosure, it is possible to solve image sticking caused by the degradation of white light emitting elements. Also, it is possible to reduce or minimize stress applied to the white light emitting elements. Therefore, it is possible to improve the reliability of the white light emitting elements.

Hereinafter, a driving method S200 of the display device according to another embodiment of the present disclosure will be described in detail with reference to FIG. 10. The driving method S200 of the display device according to another embodiment of the present disclosure is substantially the same as the driving method S100 of the display device 100 according to an embodiment of the present disclosure except a color temperature control process S280. Therefore, the color temperature control process S280 will be described in detail. Some parts of driving method S200 of the display device according to another embodiment of the present disclosure which are the same as those of the driving method S100 of the display device 100 according to an embodiment will be denoted by the same reference numerals, respectively.

Figure 11:
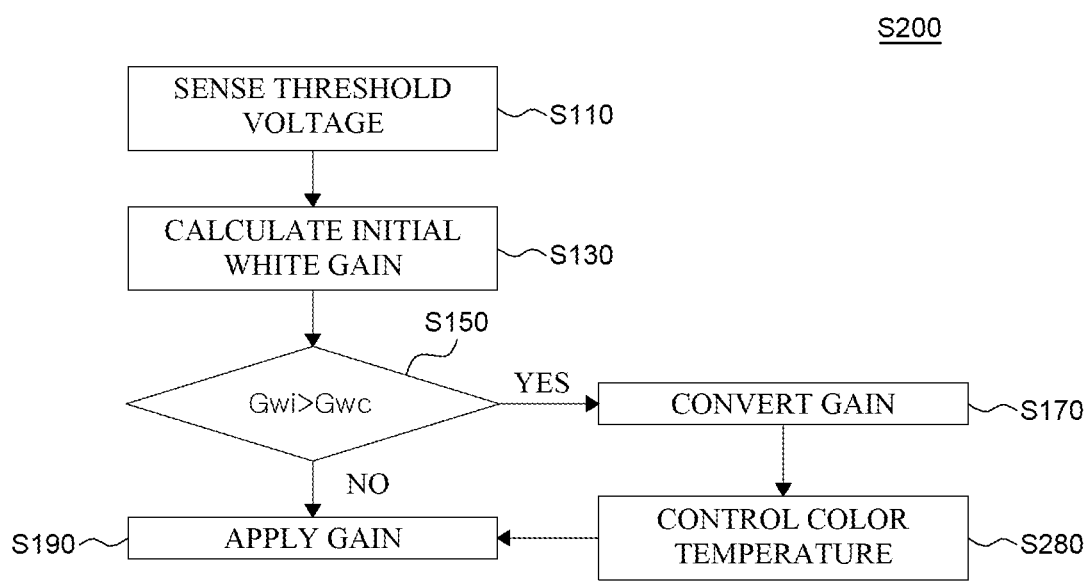
FIG. 11 is a flowchart provided to explain a driving method of the display device according to another embodiment of the present disclosure.

FIG. 11 is a flowchart provided to explain a driving method of the display device according to another embodiment of the present disclosure.

As shown in FIG. 11, a driving method S200 of the display device according to another embodiment of the present disclosure includes the threshold voltage sensing process S110, the initial white gain calculation process S130, the gain analysis process S150, the gain conversion process S170, the color temperature control process S280 and the gain application process S190.

In the color temperature control process S280, the red gain Gr, the green gain Gg and the blue gain Gb are corrected so that the color temperature of the display panel can be maintained constant or substantially constant.

Specifically, if the white light emitting element is degraded, if the driving current $I_{OLED}$ of the white light emitting element is increased by applying a white gain to white data, the color temperature of the entire display panel 110 may be distorted. Thus, in the color temperature control process S280, the red gain Gr, the green gain Gg and the blue gain Gb may be corrected and the driving current $I_{OLED}$ of the red light emitting element, the driving current $I_{OLED}$ of the green light emitting element and the driving current $I_{OLED}$ of the blue light emitting element may be controlled to correct the distorted color temperature.

That is, in the color temperature control process S280, the red gain Gr may be converted into the compensated red gain Gr'. Also, the green gain Gg may be converted into the compensated green gain Gg' and the blue gain Gb may be converted into the compensated blue gain Gb' so that the color temperature of the display panel 110 can be maintained constant or substantially constant.

Then, in the gain application process S190, the compensated red gain Gr' is applied to red data signal to output red compensated data signal. Also, the compensated green gain Gg' is applied to green data signal to output green compensated data signal. Further, the compensated blue gain Gb' is applied to blue data signal to output blue compensated data signal. Furthermore, the critical white gain Gwc is applied to white data signal to output white compensated data signal.

Therefore, in the driving method S200 of the display device according to another embodiment of the present disclosure, it is possible to control the color temperature which may be distorted by increasing the driving current $I_{OLED}$ of the white light emitting element.

As a result, the driving method of the display device according to another embodiment of the present disclosure can improve the image quality by applying a predetermined image sticking compensation method to a color temperature.

The embodiments of the present disclosure can also be described as follows:

According to an aspect of the present disclosure, a display device is provided. The display device includes a display panel including a plurality of pixels each composed of a red sub-pixel, a green sub-pixel, a blue sub-pixel and a white sub-pixel. The display device also includes a threshold voltage sensor configured to sense a threshold voltage of a white light emitting element included in the white sub-pixel. The display device further includes a data compensation unit configured to correct data signal depending on a variation in the threshold voltage and generate compensated data signal. The display device also includes a data driver configured to generate a data voltage according to the compensated data signal and output the data voltage to the display panel. The data compensation unit calculates an initial white gain depending on the variation in the threshold voltage. Also, if the initial white gain is higher than a critical white gain, the data compensation unit converts an excess white gain corresponding to a difference between the initial white gain and the critical white gain into a red gain, a green gain and a blue gain. Further, the data compensation unit applies the red gain to red data signal, the green gain to green data signal and the blue gain to blue data signal to generate the compensated data signal. Therefore, the lifetime of the display device can be improved.

In some embodiments, the data compensation unit may include an initial white gain calculation unit configured to calculate the initial white gain depending on the variation in the threshold voltage; a gain analysis unit configured to compare the initial white gain with the critical white gain; a gain conversion unit configured to convert the excess white gain into the red gain, the green gain and the blue gain if the initial white gain is higher than the critical white gain; and a gain application unit configured to apply at least one of the red gain, the green gain, the blue gain, the initial white gain and the critical white gain to the data signal to output the compensated data signal.

In some embodiments, the initial white gain may be equal to lower than the critical white gain, the gain analysis unit outputs the initial white gain to the gain application unit. If the initial white gain is higher than the critical white gain, the gain analysis unit may output the critical white gain to the gain application unit and outputs the excess white gain to the gain conversion unit.

In some embodiments, the gain conversion unit may include an RGB luminance calculation unit configured to calculate a red luminance, a green luminance and a blue luminance so as to correspond to white coordinates to be obtained by applying the excess white gain; and an RGB gain calculation unit configured to calculate the red gain, the green gain and the blue gain based on the red luminance, the green luminance and the blue luminance.

In some embodiments, the RGB luminance calculation unit may calculates the red luminance, the green luminance and the blue luminance according to Equation 1:

$$\begin{bmatrix} L_r \\ L_g \\ L_b \end{bmatrix} = \begin{bmatrix} (x_r/y_r) & (x_g/y_g) & (x_b/y_b) \\ 1 & 1 & 1 \\ (z_r/y_r) & (z_g/y_g) & (z_b/y_b) \end{bmatrix}^{-1} \begin{bmatrix} (x_n/y_n) \\ 1 \\ (z_n/y_n) \end{bmatrix} \quad \text{[Equation 1]}$$

Here, $x_n$, $y_n$, $z_n$ are the white coordinates, $x_r$, $y_r$, $z_r$ are red coordinates, $x_g$, $y_g$, $z_g$ are green coordinates, $x_b$, $y_b$, $z_b$ are blue coordinates, Lr is the red luminance, Lg is the green luminance, and Lb is the blue luminance.

In some embodiments, the RGB gain calculation unit may calculate a ratio between an initial red luminance and the red luminance as the red gain, a ratio between an initial green luminance and the green luminance as the green gain and a ratio between an initial blue luminance and the blue luminance as the blue gain.

If the initial white gain is equal to lower than a critical white gain, the gain application unit may apply the initial white gain to the white data signal. On the other hand, if the initial white gain is higher than a critical white gain, the gain application unit may apply the critical white gain to the white data signal, the red gain to the red data signal, the green gain to the green data signal and the blue gain to the blue data signal.

In some embodiments, the display device may further include a color temperature controller configured to correct the red gain, the green gain and the blue gain so that a color temperature of the display panel is maintained constant or substantially constant and output the corrected gains to the gain application unit.

In some embodiments, the RGB gain calculation unit may calculate a ratio between an initial red luminance and the red luminance as the red gain, a ratio between an initial green luminance and the green luminance as the green gain and a ratio between an initial blue luminance and the blue luminance as the blue gain.

If the initial white gain is equal to lower than a critical white gain, the gain application unit may apply the initial white gain to the white data signal. On the other hand, if the initial white gain is higher than a critical white gain, the gain application unit may apply the critical white gain to the white data signal, the red gain to the red data signal, the green gain to the green data signal and the blue gain to the blue data signal.

In some embodiments, the display device may further include a color temperature controller configured to correct the red gain, the green gain and the blue gain so that a color temperature of the display panel is maintained constant or substantially constant and output the corrected gains to the gain application unit.

In some embodiments, each of the plurality of pixels may include an organic light emitting diode which is the light emitting element; a driving circuit configured to drive the organic light emitting diode; and a sensing circuit configured to sense a threshold voltage of the organic light emitting diode.

In some embodiments, the driving circuit may include a driving transistor configured to apply a driving current to the organic light emitting diode; a scan transistor configured to apply the data voltage to a gate electrode of the driving transistor; and a storage capacitor configured to maintain a gate-source voltage of the driving transistor for one frame.

In some embodiments, the sensing circuit may include a sensing transistor configured to connect an electrode of the organic light emitting diode and a sensing line in response to a sensing signal; a reference transistor configured to apply a reference voltage to the sensing line in response to a reference signal; and a sampling transistor configured to apply the voltage applied to the sensing line to the threshold voltage sensor in response to a sampling signal.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. All the technical concepts in the present disclosure and the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a display panel including a plurality of pixels each composed of a red sub-pixel, a green sub-pixel, a blue sub-pixel, and a white sub-pixel;
   a threshold voltage sensor configured to sense a threshold voltage of a white light emitting element included in the white sub-pixel;
   a data compensation circuit configured to correct data signal depending on a variation in the threshold voltage and generate compensated data signal; and
   a data driver configured to generate a data voltage according to the compensated data signal and output the data voltage to the display panel,
   wherein the data compensation circuit calculates an initial white gain depending on the variation in the threshold voltage, and
   if the initial white gain is higher than a critical white gain, the data compensation circuit converts an excess white gain corresponding to a difference between the initial white gain and the critical white gain into at least one of a red gain, a green gain and a blue gain, and
   the data compensation circuit applies the red gain to red data signal, the green gain to green data signal, and the blue gain to blue data signal to generate the compensated data signal.

2. The display device according to claim 1, wherein the data compensation circuit includes:
   an initial white gain calculation circuit configured to calculate the initial white gain depending on the variation in the threshold voltage;
   a gain analysis circuit configured to compare the initial white gain with the critical white gain;
   a gain conversion circuit configured to convert the excess white gain into at least one of the red gain, the green gain and the blue gain if the initial white gain is higher than the critical white gain; and
   a gain application circuit configured to apply at least one of the red gain, the green gain, the blue gain, the initial white gain and the critical white gain to the data signal to output the compensated data signal.

3. The display device according to claim 2, wherein based on the initial white gain being equal to lower than the critical white gain, the gain analysis circuit outputs the initial white gain to the gain application circuit.

4. The display device according to claim 2, wherein based on the initial white gain being higher than the critical white gain, the gain analysis circuit outputs the critical white gain to the gain application circuit and outputs the excess white gain to the gain conversion circuit.

5. The display device according to claim 2, wherein the gain conversion circuit includes:
   an RGB luminance calculation circuit configured to calculate a red luminance, a green luminance and a blue luminance so as to correspond to white coordinates to be obtained by applying the excess white gain; and
   an RGB gain calculation circuit configured to calculate the red gain, the green gain and the blue gain based on the red luminance, the green luminance and the blue luminance.

6. The display device according to claim 5, wherein the RGB luminance calculation circuit calculates the red luminance, the green luminance and the blue luminance according to Equation 1:

$$\begin{bmatrix} L_r \\ L_g \\ L_b \end{bmatrix} = \begin{bmatrix} (x_r/y_r) & (x_g/y_g) & (x_b/y_b) \\ 1 & 1 & 1 \\ (z_r/y_r) & (z_g/y_g) & (z_b/y_b) \end{bmatrix}^{-1} \begin{bmatrix} (x_n/y_n) \\ 1 \\ (z_n/y_n) \end{bmatrix}$$ [Equation 1]

wherein $x_n$, $y_n$, $z_n$ are the white coordinates, $x_r$, $y_r$, $z_r$ are red coordinates, $x_g$, $y_g$, $z_g$ are green coordinates, $x_b$, $y_b$, $z_b$ are blue coordinates, Lr is the red luminance, Lg is the green luminance, and Lb is the blue luminance.

7. The display device according to claim 5, wherein the RGB gain calculation circuit calculates a ratio between an initial red luminance and the red luminance as the red gain, a ratio between an initial green luminance and the green luminance as the green gain and a ratio between an initial blue luminance and the blue luminance as the blue gain.

8. The display device according to claim 2, wherein based on the initial white gain being equal to lower than a critical white gain, the gain application circuit applies the initial white gain to the white data signal.

9. The display device according to claim 2, wherein based on the initial white gain being higher than a critical white gain, the gain application circuit applies the critical white gain to the white data signal, the red gain to the red data signal, the green gain to the green data signal and the blue gain to the blue data signal.

10. The display device according to claim 2, further comprising:
a color temperature controller configured to correct the red gain, the green gain and the blue gain so that a color temperature of the display panel is maintained constant or substantially constant and output the corrected gains to the gain application circuit.

11. The display device according to claim 1, wherein each of the plurality of pixels includes:
an organic light emitting diode which is the light emitting element;
a driving circuit configured to drive the organic light emitting diode; and
a sensing circuit configured to sense a threshold voltage of the organic light emitting diode.

12. The display device according to claim 11, wherein the driving circuit includes:
a driving transistor configured to apply a driving current to the organic light emitting diode;
a scan transistor configured to apply the data voltage to a gate electrode of the driving transistor; and
a storage capacitor configured to maintain a gate-source voltage of the driving transistor for one frame.

13. The display device according to claim 11, wherein the sensing circuit includes:
a sensing transistor configured to connect an electrode of the organic light emitting diode and a sensing line in response to a sensing signal;
a reference transistor configured to apply a reference voltage to the sensing line in response to a reference signal; and
a sampling transistor configured to apply the voltage applied to the sensing line to the threshold voltage sensor in response to a sampling signal.

\* \* \* \* \*